(12) United States Patent
Huang et al.

(10) Patent No.: US 12,261,116 B2
(45) Date of Patent: Mar. 25, 2025

(54) BACKSIDE SIGNAL ROUTING

(71) Applicant: Taiwan Semiconductor Manufacturing Company, Ltd., Hsinchu (TW)

(72) Inventors: Ching-Yu Huang, Hsinchu (TW); Wei-Cheng Lin, Taichung (TW); Shih-Wei Peng, Hsinchu (TW); Jiann-Tyng Tzeng, Hsinchu (TW); Yi-Kan Cheng, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 292 days.

(21) Appl. No.: 17/691,582

(22) Filed: Mar. 10, 2022

(65) Prior Publication Data
US 2023/0040094 A1 Feb. 9, 2023

Related U.S. Application Data

(60) Provisional application No. 63/229,798, filed on Aug. 5, 2021.

(51) Int. Cl.
| | |
|---|---|
| *H01L 23/528* | (2006.01) |
| *H01L 21/8234* | (2006.01) |
| *H01L 23/48* | (2006.01) |
| *H01L 23/522* | (2006.01) |
| *H01L 27/088* | (2006.01) |

(52) U.S. Cl.
CPC .. *H01L 23/5286* (2013.01); *H01L 21/823475* (2013.01); *H01L 23/481* (2013.01); *H01L 23/5283* (2013.01); *H01L 23/5226* (2013.01); *H01L 27/088* (2013.01)

(58) Field of Classification Search
CPC ......... H01L 23/5286; H01L 21/823475; H01L 23/481; H01L 23/5283; H01L 23/5226; H01L 27/088; H01L 21/76897
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 10,020,255 B1 | 7/2018 | Bao et al. | |
| 10,886,217 B2 | 1/2021 | Morrow et al. | |

(Continued)

FOREIGN PATENT DOCUMENTS

| | | |
|---|---|---|
| TW | 201208017 A | 2/2012 |
| TW | 202105689 A | 2/2021 |

*Primary Examiner* — Karen Kusumakar
*Assistant Examiner* — Adam S Bowen
(74) *Attorney, Agent, or Firm* — Merchant & Gould P.C.

(57) ABSTRACT

In some embodiments, an integrated circuit device includes a substrate having a frontside and a backside; one or more active semiconductor devices formed on the frontside of the substrate; conductive paths formed on the frontside of the substrate; and conductive paths formed on the backside of the substrate. At least some of the conductive paths formed on the backside of the substrate, and as least some of the conductive paths formed on the front side of the substrate, are signal paths among the active semiconductor devices. In in some embodiments, other conductive paths formed on the backside of the substrate are power grid lines for powering at least some of the active semiconductor devices.

20 Claims, 20 Drawing Sheets

(56) References Cited

U.S. PATENT DOCUMENTS

| | | |
|---|---|---|
| 11,139,241 B2 | 10/2021 | Morrow et al. |
| 11,276,677 B1 | 3/2022 | Deng et al. |
| 11,302,631 B2 | 4/2022 | Chiu et al. |
| 11,309,334 B2 | 4/2022 | Lin et al. |
| 11,328,750 B1 | 5/2022 | Amirante et al. |
| 11,404,374 B2 | 8/2022 | Lim et al. |
| 11,557,583 B2 | 1/2023 | Chen et al. |
| 11,616,015 B2 | 3/2023 | Morrow et al. |
| 2014/0040838 A1 | 2/2014 | Liu et al. |
| 2015/0278429 A1 | 10/2015 | Chang |
| 2019/0020343 A1 | 1/2019 | Lee et al. |
| 2019/0051641 A1 | 2/2019 | Lee et al. |
| 2019/0259699 A1 | 8/2019 | Morrow et al. |
| 2019/0312023 A1 | 10/2019 | Morrow et al. |
| 2020/0027780 A1* | 1/2020 | Briggs .............. H01L 21/76879 |
| 2020/0105671 A1* | 4/2020 | Lai ......................... G06F 30/39 |
| 2020/0134128 A1* | 4/2020 | Peng .................... H01L 23/535 |
| 2021/0028112 A1* | 1/2021 | Kim .................. H01L 29/41791 |
| 2021/0104551 A1 | 4/2021 | Lin et al. |
| 2021/0111115 A1 | 4/2021 | Morrow et al. |
| 2022/0028779 A1 | 1/2022 | Morrow et al. |
| 2022/0077134 A1 | 3/2022 | Chen et al. |
| 2022/0102266 A1 | 3/2022 | Lim et al. |
| 2022/0147679 A1 | 5/2022 | Edathil et al. |
| 2022/0157723 A1* | 5/2022 | Park .................... H01L 23/5286 |
| 2022/0188496 A1 | 6/2022 | Edathil et al. |
| 2022/0223514 A1 | 7/2022 | Sisodia et al. |
| 2022/0223624 A1 | 7/2022 | Lin et al. |
| 2022/0254770 A1 | 8/2022 | Lai et al. |
| 2022/0328399 A1* | 10/2022 | Preston ................. H01L 23/522 |

\* cited by examiner

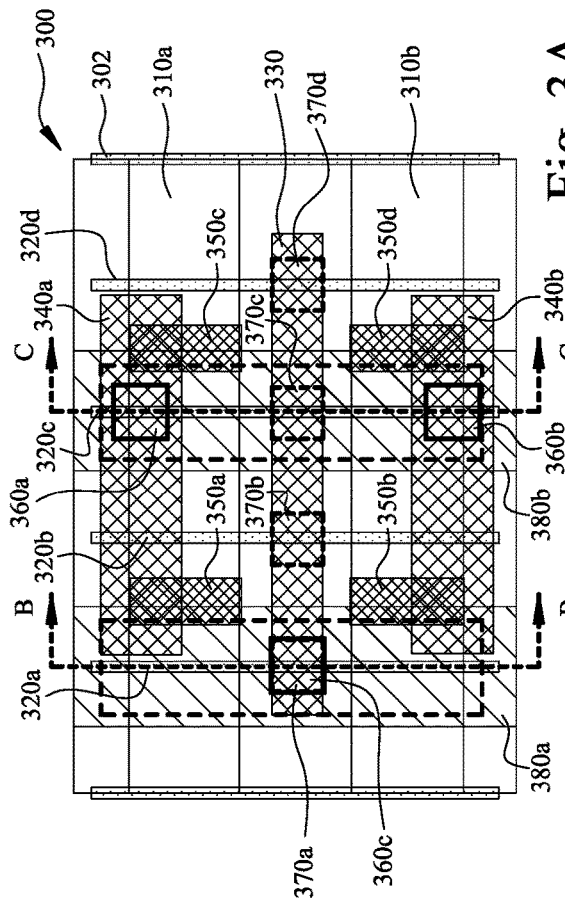
Fig. 3A
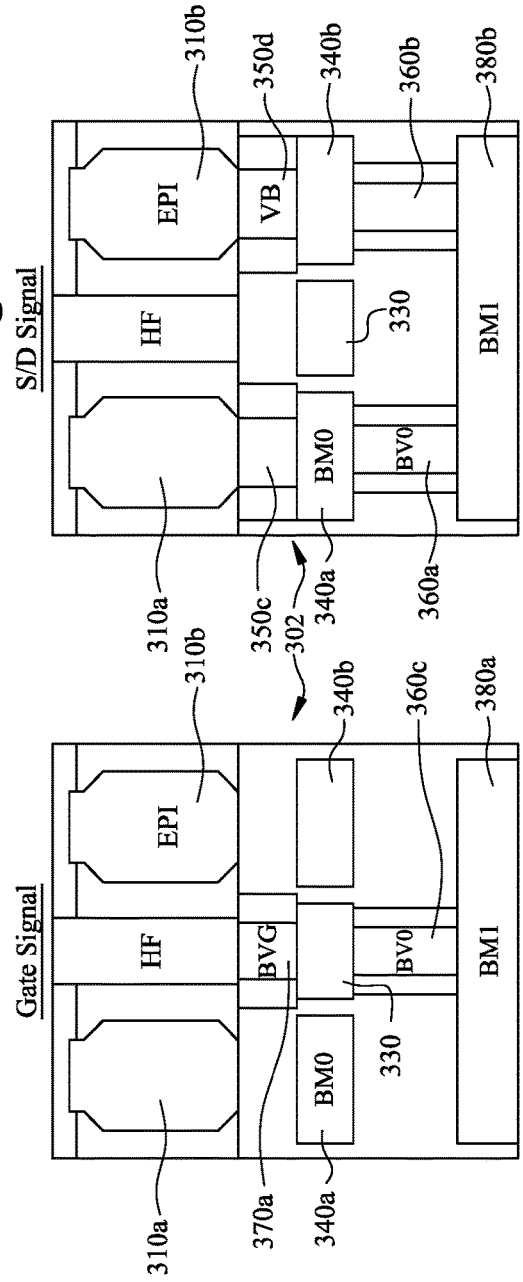
Fig. 3B
Fig. 3C

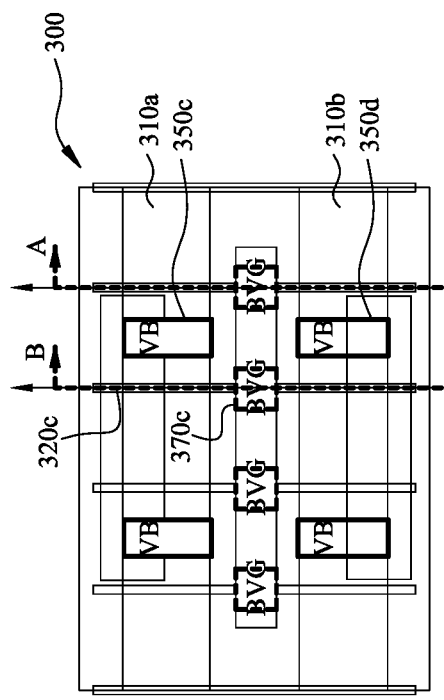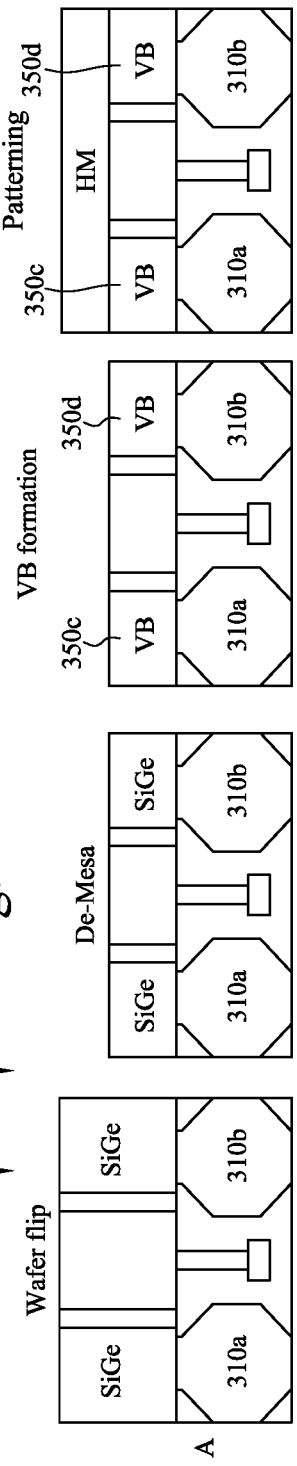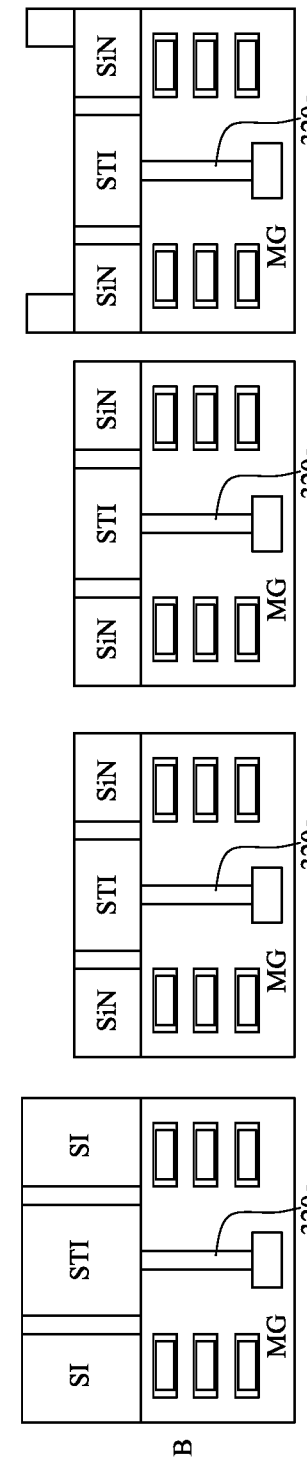

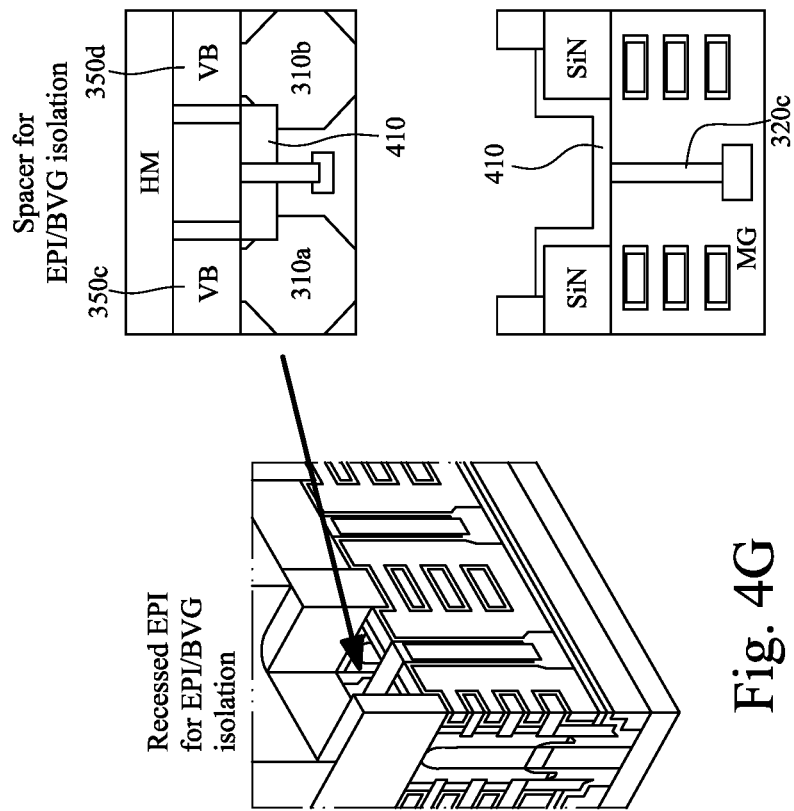
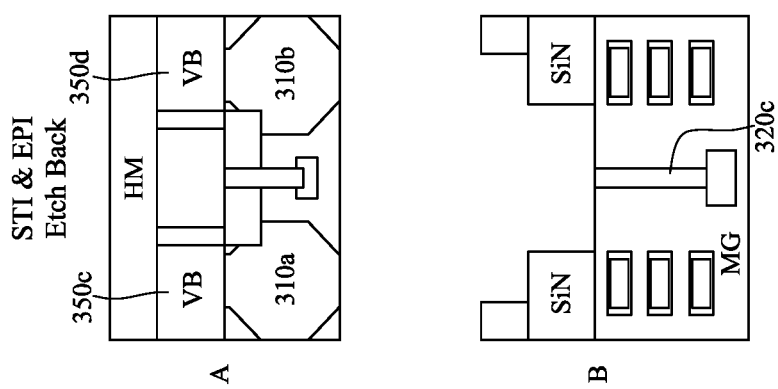
Fig. 4F  Fig. 4G  Fig. 4H

Case-D

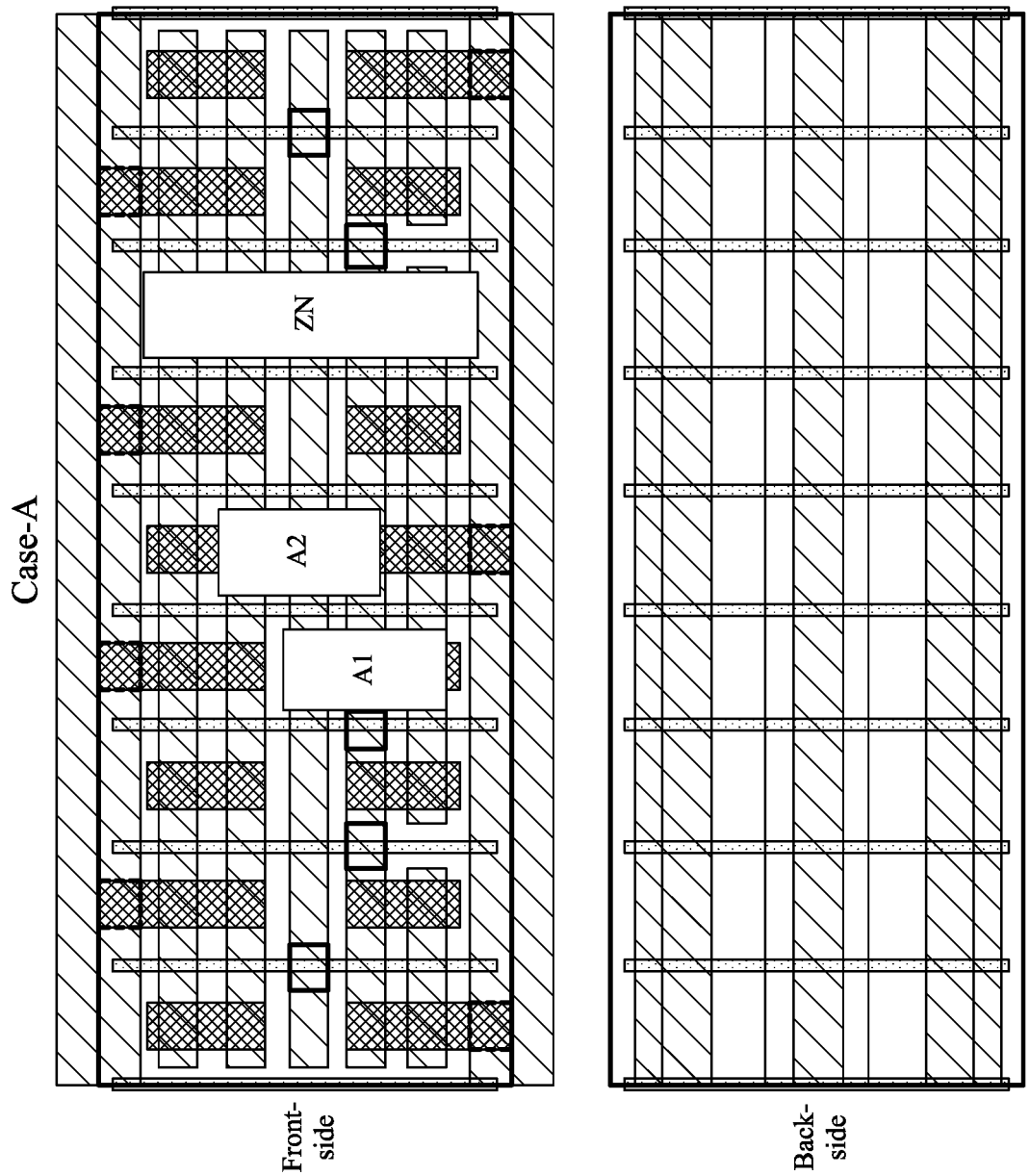

BACKSIDE SIGNAL ROUTING

BACKGROUND

Densities of integrated circuit devices have been increasing steadily. According to Moore's law, the number of transistors in integrated circuits (IC) doubles about every two years. As the device density increases in IC devices (including reduced device cell height), the sizes of conductive lines, including signal lines, have decreased. The decreased sizes of conductive lines negatively impact the performance of IC devices due to the increased RC. Efforts are ongoing to maintain or improve IC device performance as the device densities increase.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A shows a layout of an IC device with backside signal routing according to some embodiments.

FIG. 3B shows a cross-section of the IC device shown in FIG. 1A, showing a gate signal path.

FIG. 3C shows a cross-section of the IC device shown in FIG. 1A, showing source and drain signal paths.

FIG. 5B schematically shows the physical elements in an output path of an output signal for the IC device shown in FIG. 5A according to some embodiments.

FIGS. 7A-7E illustrates example combinations of front side signal routing and back sight signal routing for a NAND gate according to some embodiments.

DETAILED DESCRIPTION

Figure 1:
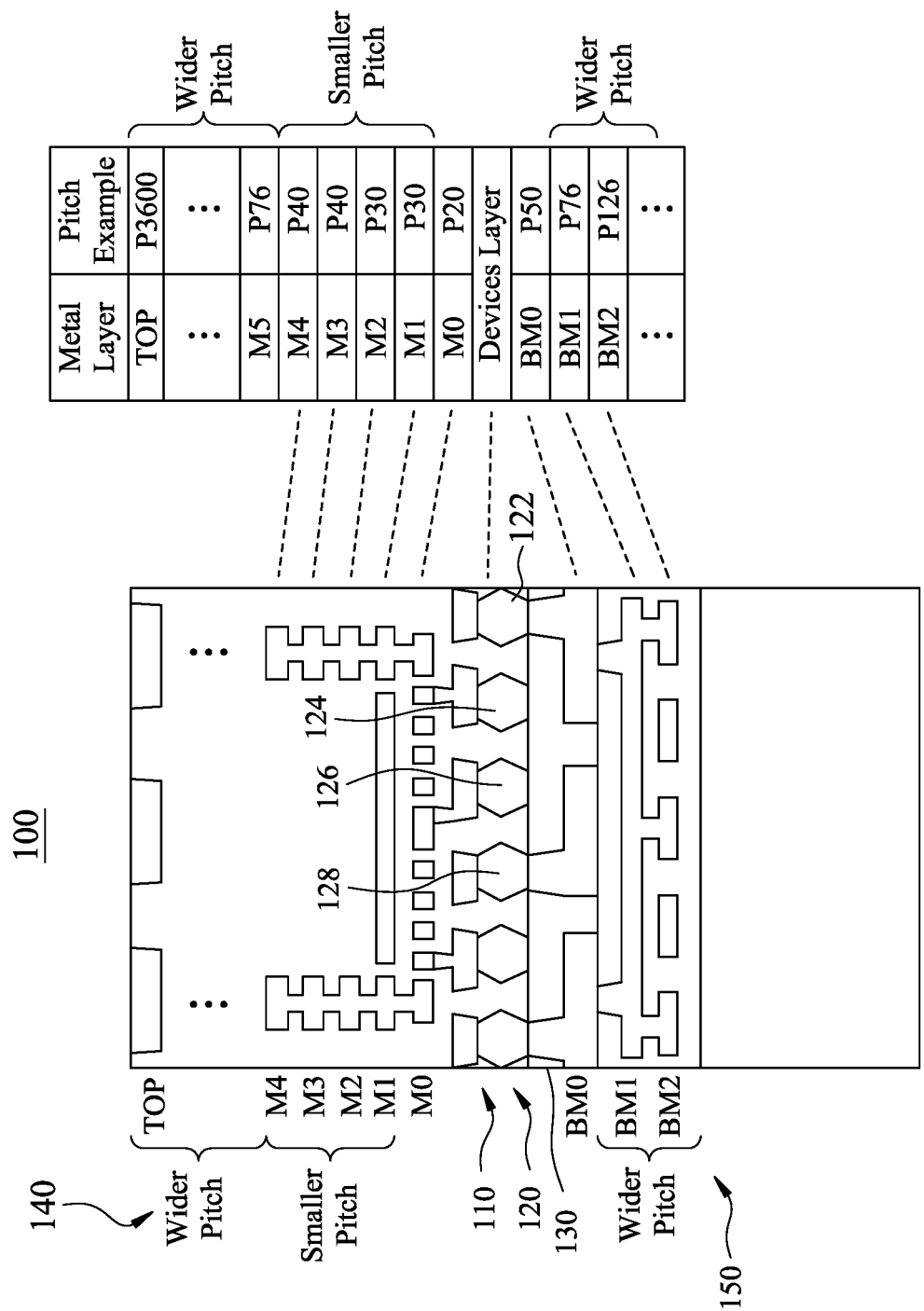
FIG. 1 schematically shows a general scheme of backside signal routing in an IC device according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates to signal routing integrated circuit (IC) devices. Densities of integrated circuit devices have been increasing steadily over decades. According to Moore's law, the number of transistors in integrated circuits (IC) doubles about every two years. As the device density increases in IC devices (including reduced device cell height), the sizes of conductive lines, including signal lines, have decreased. The decreased sizes of conductive lines negatively impact the performance of IC devices due to the increased RC. In accordance with some aspects of the present disclosure, signal paths are disposed on the backside, i.e., on the side of the IC substrate opposite to the side where the active semiconductor devices are formed. While IC power grids have been constructed at least in part with backside conductive layers, as in the case of backside "super power rail" (SPR), examples in the present disclosure provide input/output signal routing through backside conductive layers. In accordance with aspects of the present disclosure, signal routing through wider backside conductive paths, or more numerous backside conductive paths, is provided, thereby reducing the overall impedance of the signal transmission path and improving the performance of the IC device.

In some embodiments, signal paths of mixed front-side and backside segments are provided to optimize the IC performance. In some embodiments backside signal routing is provided for only certain portions of an IC device, for example those portions the performance of which significantly impacts the overall performance of the IC device. In some embodiments, a backside gate voltage (VG) (BVG) is provided by connecting a gate contact on the frontside to a backside conductive line through a conductive pillar (backside and via (BV)). In some embodiments, multiple backside conductive lines are connected to corresponding output terminals (e.g., source/drain contacts) on the frontside.

In some embodiments, as shown in FIG. 1, an integrated circuit (IC) device 100 includes an active device layer 110, including semiconductor devices, such as transistors with contact regions 120, such as source and/or drain contacts 122, 124 and gate contacts 126, 128. The active device layer 110 is formed on the top surface, or frontside, of a substrate 120, such as a silicon wafer, which may have been thinned during the fabrication process for the IC. The IC device 100 also includes frontside layers 140 of conductive lines, or traces, above the active device layer 110, and backside layers 150 of conductive lines, or traces, below the substrate 130. The lower layers (in this example M0 through M4) among the frontside layers 140 are generally layers of smaller pitch (i.e. narrower) conductive lines than the upper layers (in this example M5 and above) among the frontside layers 140. The backside layers (in this example BM1, BM2, etc.) below the substrate 130 are generally layers of wider pitch (i.e., wider) conductive lines than the lower layers among the front layers 140. In this example, some of the contact regions, such as source/drain contact 124 and gate contact 126, are connected to the frontside layers 140 at the lowest frontside layer M0; other contact regions such as gate contact 128 and source/drain contact 122, are connected to the backside layers 150 at the uppermost backside layer BM0. The components in the active device layer in some examples have significant impact on the performance of the IC device 100, and routing signals of these components through wider pitched backside layers can significantly improve the performance of those components and, consequently, of the entire IC device 100.

Figure 2:
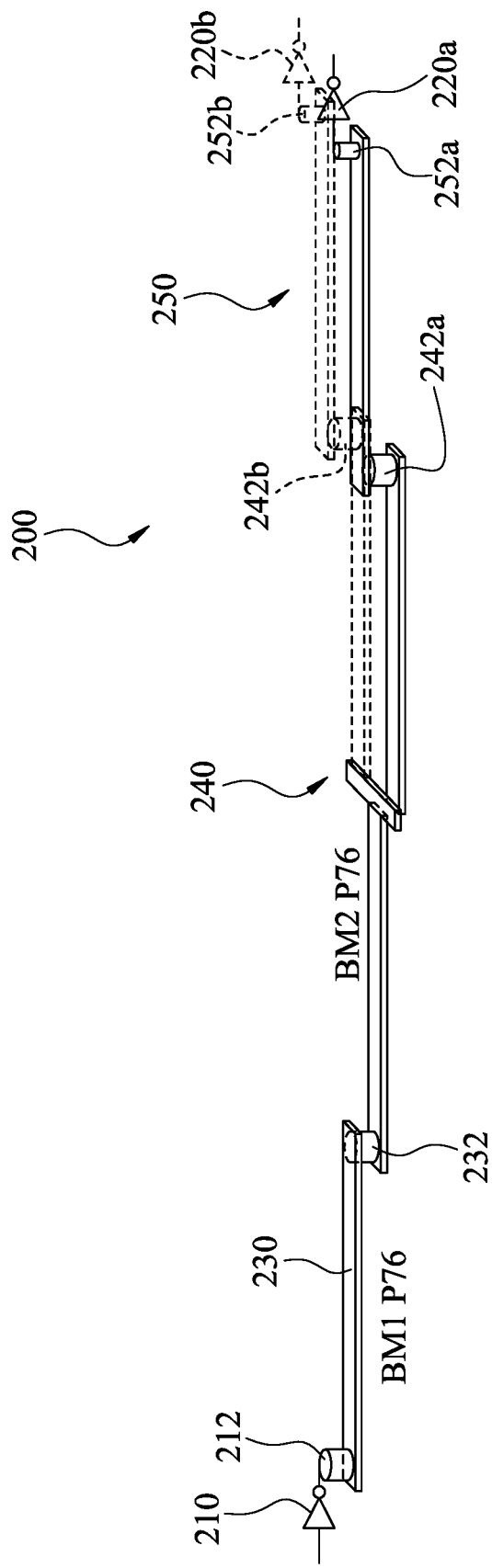
FIG. 2 shows an example of backside signal routing according to some embodiments

In some embodiments, as schematically shown in FIG. 2, backside signal layers 200 are connected to signal input/output terminals of active devices 210, 220a, 220b through backside vias (BVs) and can include two or more layers of conductive lines connected to each other through additional vias. In this example, a conductive line 230 in the first backside signal layer (BM1) is connected to the output of the device (in this example an inverter) 210 by a backside via 212; a branched conductive line 240 in the second backside signal layer (BM2) is connected to line 230 the first backside signal layer (BM1) by a backside via 232; a pair of conductive lines 250 back in the first backside signal layer (BM1) are connected to the branch to conductive line 240 in the second backside signal layer (BM2) by vias 242a, 242b, respectively; and the input terminals of active devices (in this example inverters) 220a, 220b are connected to the conductive lines 250 in the first backside signal layer (BM1) by vias 252a, 252b.

Because of the complexity (e.g., a high number of layers and complex configuration of each layer) of the front side metal layers, signal routing through the front side can negatively impact the performance of the devices. In contrast, backside signal routing, with reduced complexity as compared to the front side routing, can result in better device performance. For example, it has been found that a backside routing configuration as shown in FIG. 2 has a significant (e.g., >10%) improvement in speed than similarly configured frontside routing configuration in which the output signal is routed through more layers and/or through narrower pitched (smaller) vias.

An example active device 300 (an inverter this example) configured for backside signal routing is shown in FIGS. 3A-3C. The device includes a substrate 302, which in this example is a silicon (Si) substrate. Active semiconductor regions 310a, 310b, such as semiconductor fins for fin field-effect transistors (finFETs), with an insulating region in between (including the region labeled "HF", are formed on the top surface, or frontside, of the substrate 302. Gates 320a, 320b, 320c, 320d are formed on top of the active semiconductor region 310a, 310b, with intervening insulating layers (not shown). Below the substrate 302 are the first backside metal layer BM0, including metal lines 330, 340a, 340b, and second backside metal layer BM1 below BM0. The active semiconductor regions 310a, 310b are connected to BM0 by the through-wafer vias VB 350a, 350b, 350c, 350d, respectively; the gates 320a, 320b, 320c, 320d are connected to the metal line 330 in the layer BM0 by the through-wafer via BVG 370a, 370b, 370c, 370d, respectively. The metal line 330 in layer BM0 is connected to the metal line 380a in layer BM1 by a via 360c; the metal lines 340a, 340b in layer BM0 are connected to the metal line 380b in layer BM1 by vias BV0 360a, 360b, respectively.

Thus, signals can be applied to the gates, as well as outputted from the sources/drains, through the backside metal layers BM0 and BM1.

In some embodiments, backside signal routing paths, such as a backside gate voltage (BVG) path, are made as shown by the example in FIG. 4. In this example a BVG 370c in the device 300 can be made following the steps illustrated in FIGS. 4B-4M with cross-sections A and B referenced in FIG. 4A.

Figure 4M:
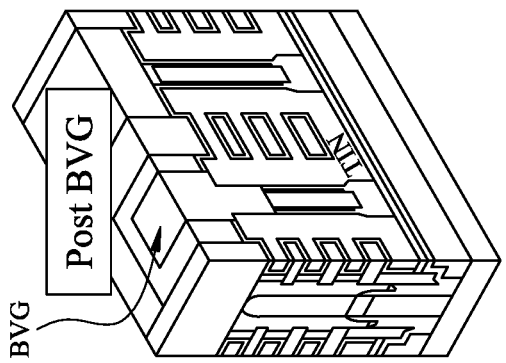
FIG. 4A schematically shows an IC device with backside signal routing according to some embodiments.
FIGS. 4B, C, D, E, F, G, H, J, K, L, and M schematically show cross-sections of the IC device shown in FIG. 4A at various stages of forming a backside data voltage (VG) path.
Figure 4L:
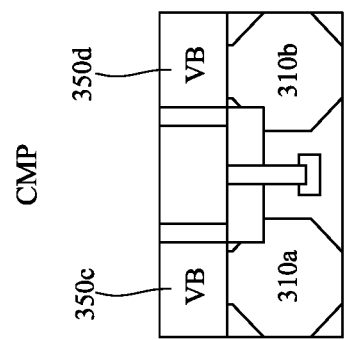
Figure 4L:
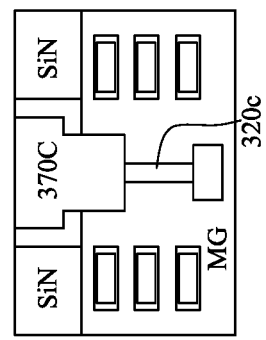
Figure 4K:
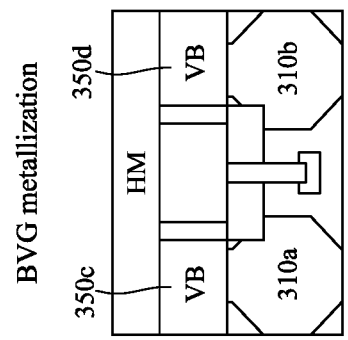
Figure 4K:
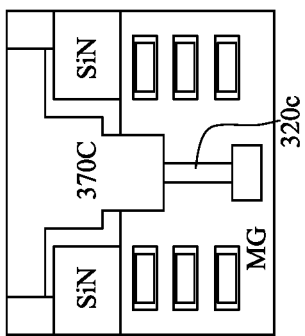
Figure 4J:
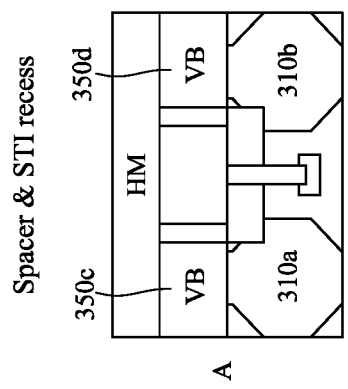
Figure 4J:
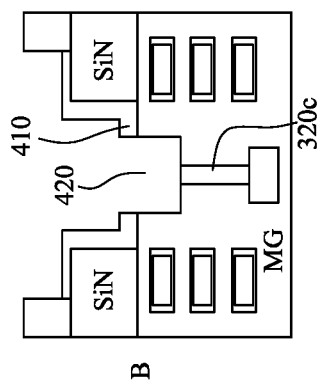

As shown in FIG. 4B, after at least certain frontside structures have been made, the substrate or wafer is flipped over, and the backside of the wafer is processed. In this example structure, the active regions 310a, 310b were formed in the top portions of Si fins by replacing the Si with SiGe and growing epitaxial bodies (EPI) from the SiGe. As a result, SiGe regions remain under (with the front side viewed as above the backside) the EPI active semiconductor regions 310a, 310b. First, as shown in FIG. 4C, the wafer is thinned from its backside by any suitable mechanical and/or chemical thinning process. Next, as shown in FIG. 4D, the SiGe regions under the epitaxial source/drain regions 310a, 310b are removed, for example by etching, and replaced with a conductive material, such as a metal to form the through-wafer vias (VB) 350c, 350d. Next, as shown in FIG. 4E, a hard mask (HM) is deposited under the wafer and a window is opened in the hard mask under the gate region 320 C for the formation of the backside gate voltage (BVG) path. Next, as shown in FIG. 4F, materials exposed by the opening in the hard mask, including portions of the EPI regions and the shallow trench insulation (STI) oxide, which was deposited during the frontside processing steps, are removed, for example by etching. Next, as shown in FIGS. Four 4G and 4H, a layer off insulating spacer material 410 is deposited in the region of removed STI and EPI to isolate the EPI regions from the BVG to be formed. Next, as shown in FIG. 4J, and opening is formed in the spacer layer 410, and a recess 420 toward the frontside is formed, for example by edging, to expose the gate region to the backside. Next, as shown in FIG. 4K, the opening 420 and below is filled by a conductive material, such as a metal. Next as shown in FIGS. 4L and 4M, the backside is polished, for example by chemical mechanical polishing (CMP) to remove the hard mask layer. A BVG path 370c is thus constructed.

Figure 5C:
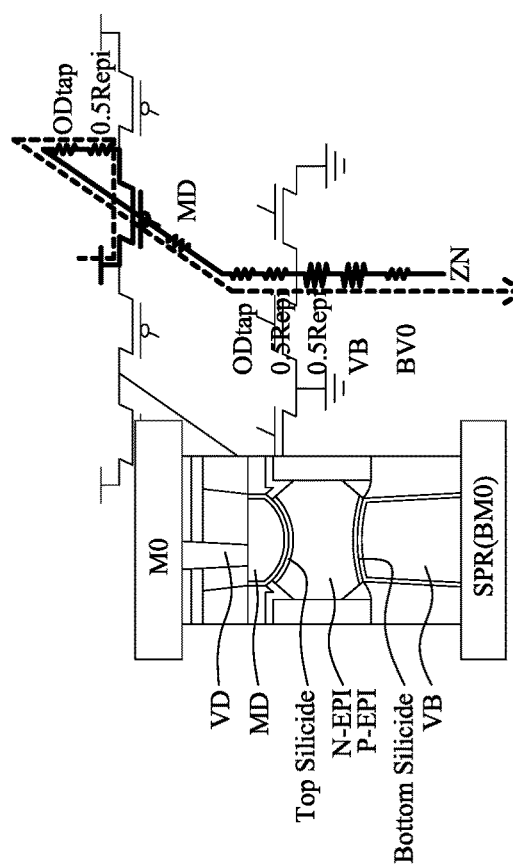
FIG. 5C schematically shows the resistance for the output path shown in FIG. 5B shown in FIG. 5B.
Figure 5C:
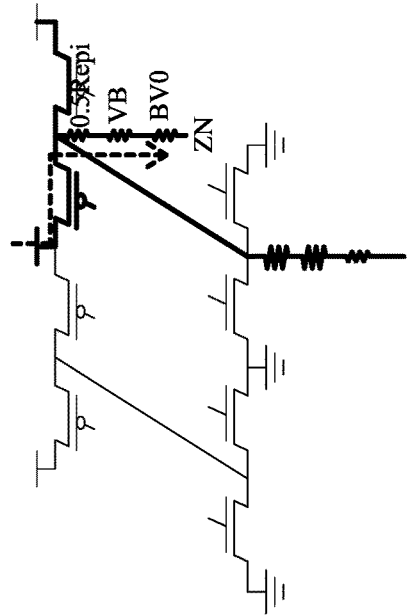
Figure 5A:
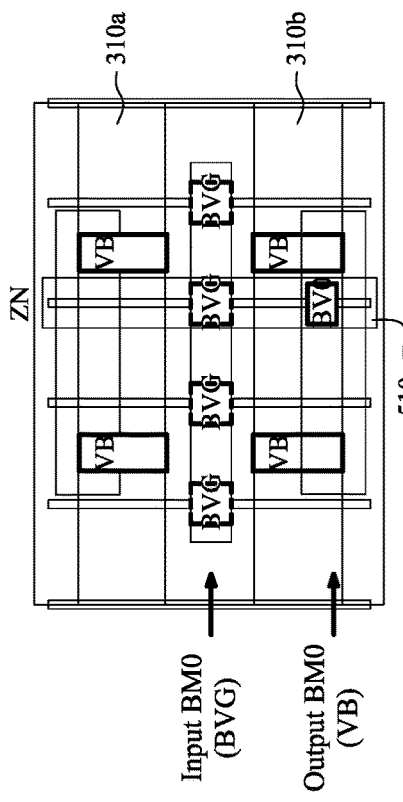
FIG. 5A schematically shows an IC device with the backside signal routing with a single backside metal output line in some embodiments.
Figure 5E:
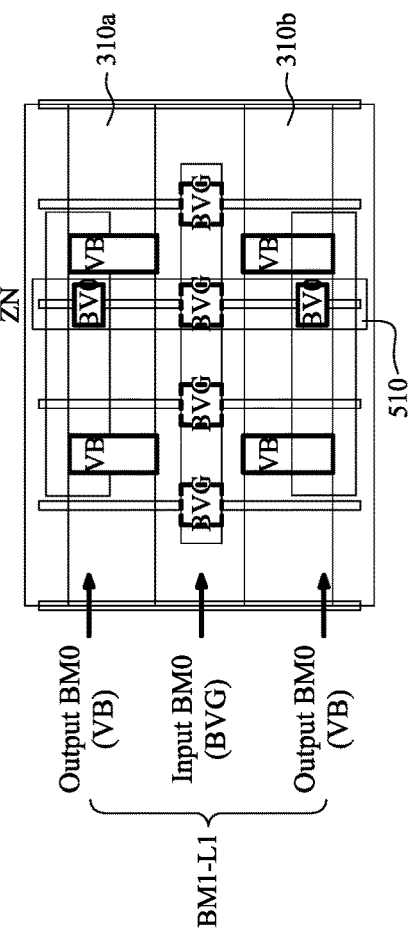
FIG. 5E schematically shows a resistance for each output path shown in FIG. 5D.
Figure 5D:
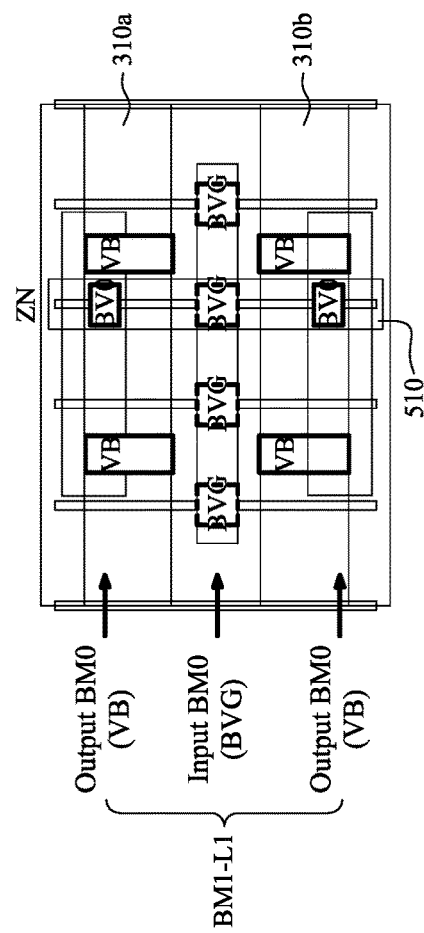
FIG. 5D schematically shows an IC device with the backside signal routing with two backside metal output lines in some embodiments.

In another aspect of this disclosure. In some embodiments, multiple backside signal routing paths are formed to reduce output impedance. As an example, in the device shown in FIG. 5A, the output source/drain contact on the side of one active semiconductor region 310a and the output source/drain contact on the side of one active semiconductor region 310b are connected to each other to form a common output, as is the case for, for example, any inverter. In the example shown in FIG. 5A, a single backside signal routing path is provided by contacting the source/drain contact on the side of active semiconductor region 310*b* to and output line ZN through via VB and BV0 (FIG. 3C), and the connection between the output source/drain contacts is provided by the conductive layer MD in the device layer (see FIG. 5B). As shown in FIG. 5C, the impedance from the EPI region on the side of active semiconductor region 310*a* to the output line ZN is that of a series of many components, including various contacts and the MD path. In contrast, in the device shown in FIG. 5D, fax I signal paths are provided at both active semiconductor regions 310*a* and 310*b*, and both paths (each including VB and BVO in this example) are connected to the output line ZN. As shown in FIG. 5E, the output resistance is much reduced compared to the case shown in FIG. 5C, involving only the resistances of the EPI region itself and of VB and BV0.

Figure 6A:
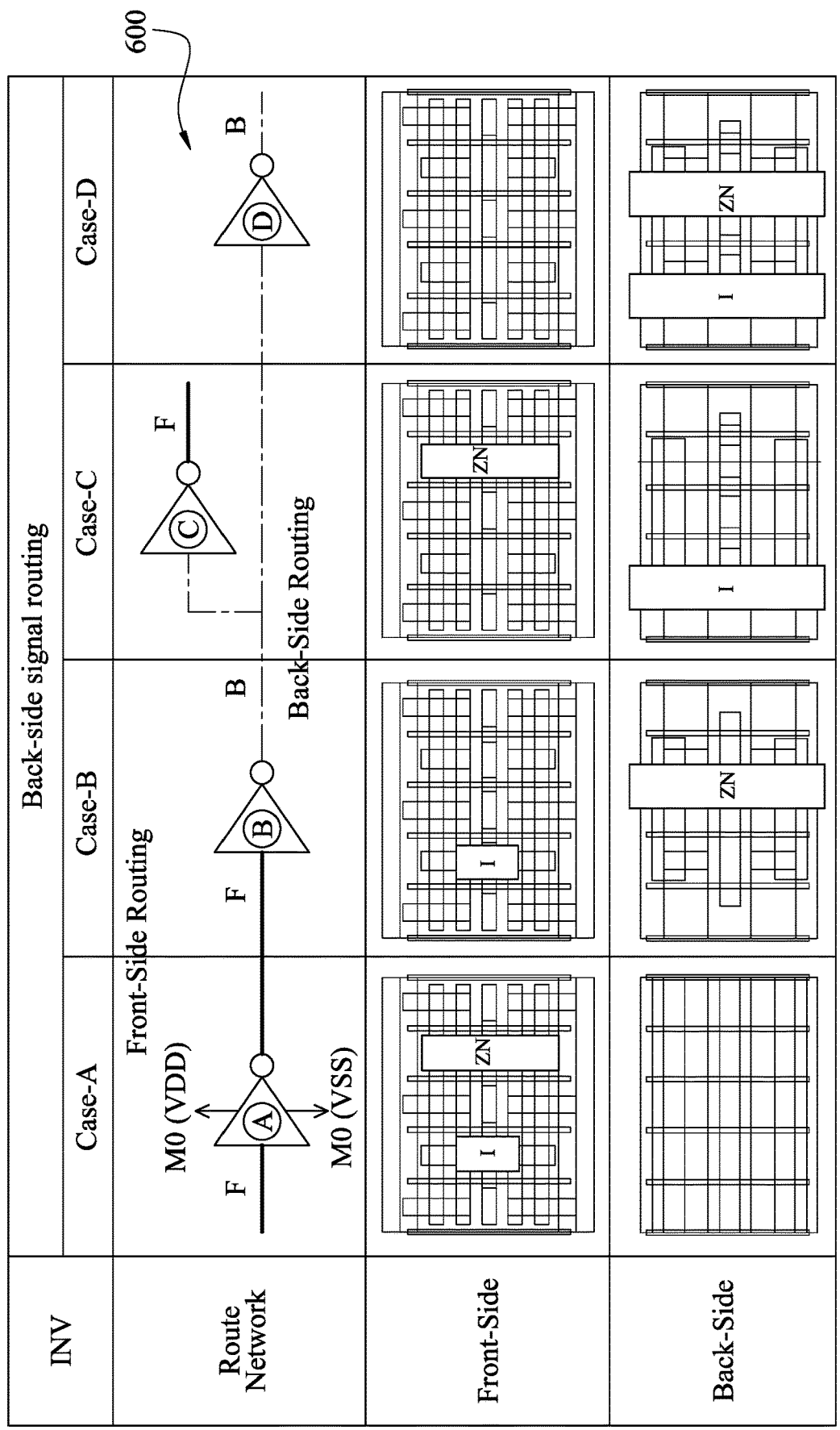
FIGS. 6A-6E illustrates example combinations of front side signal routing and back sight signal routing for an inverter, and the corresponding performance of the inverter according to some embodiments.
Figure 6B:
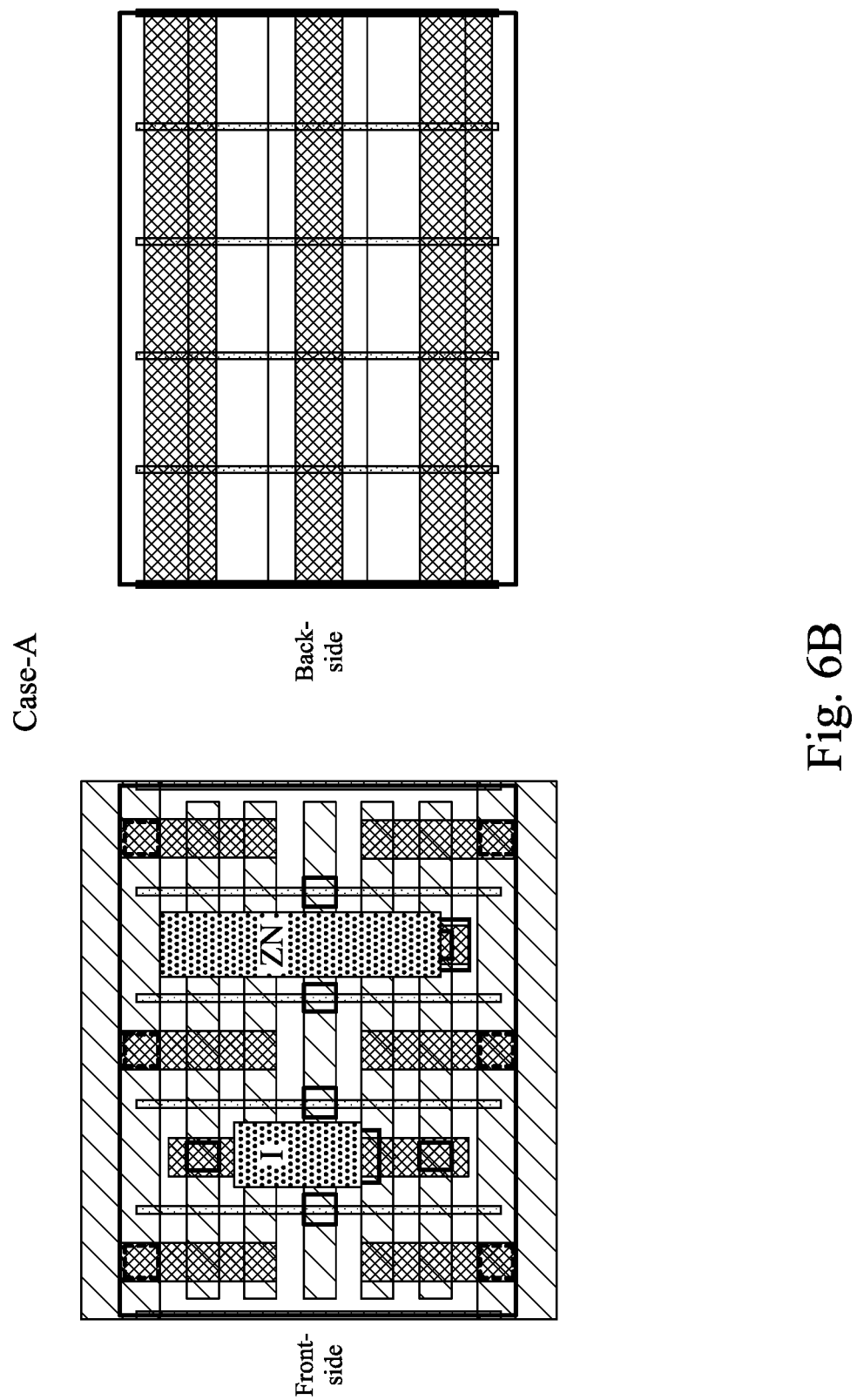
Figure 6C:
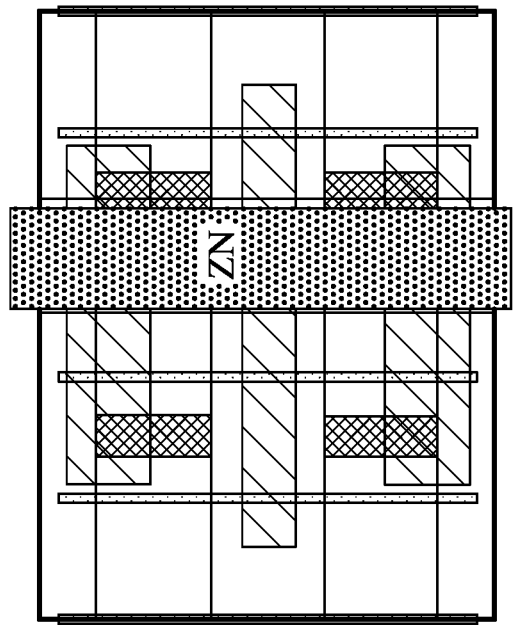
Figure 6C:
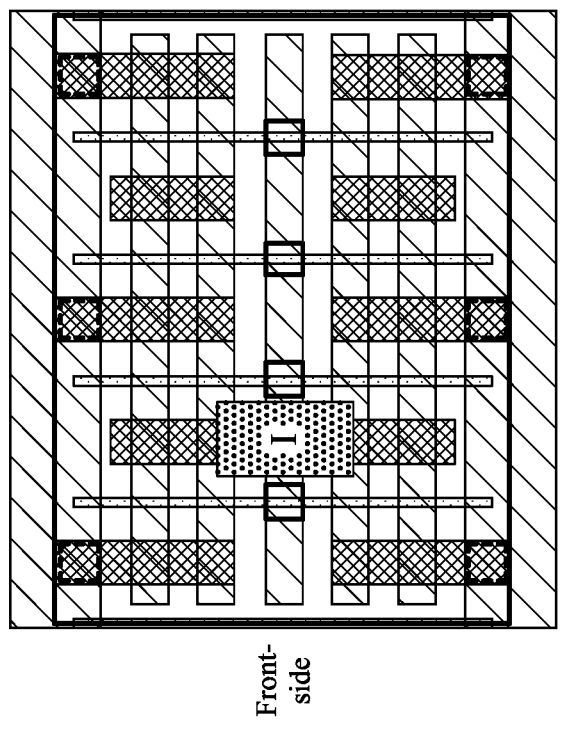
Figure 6D:
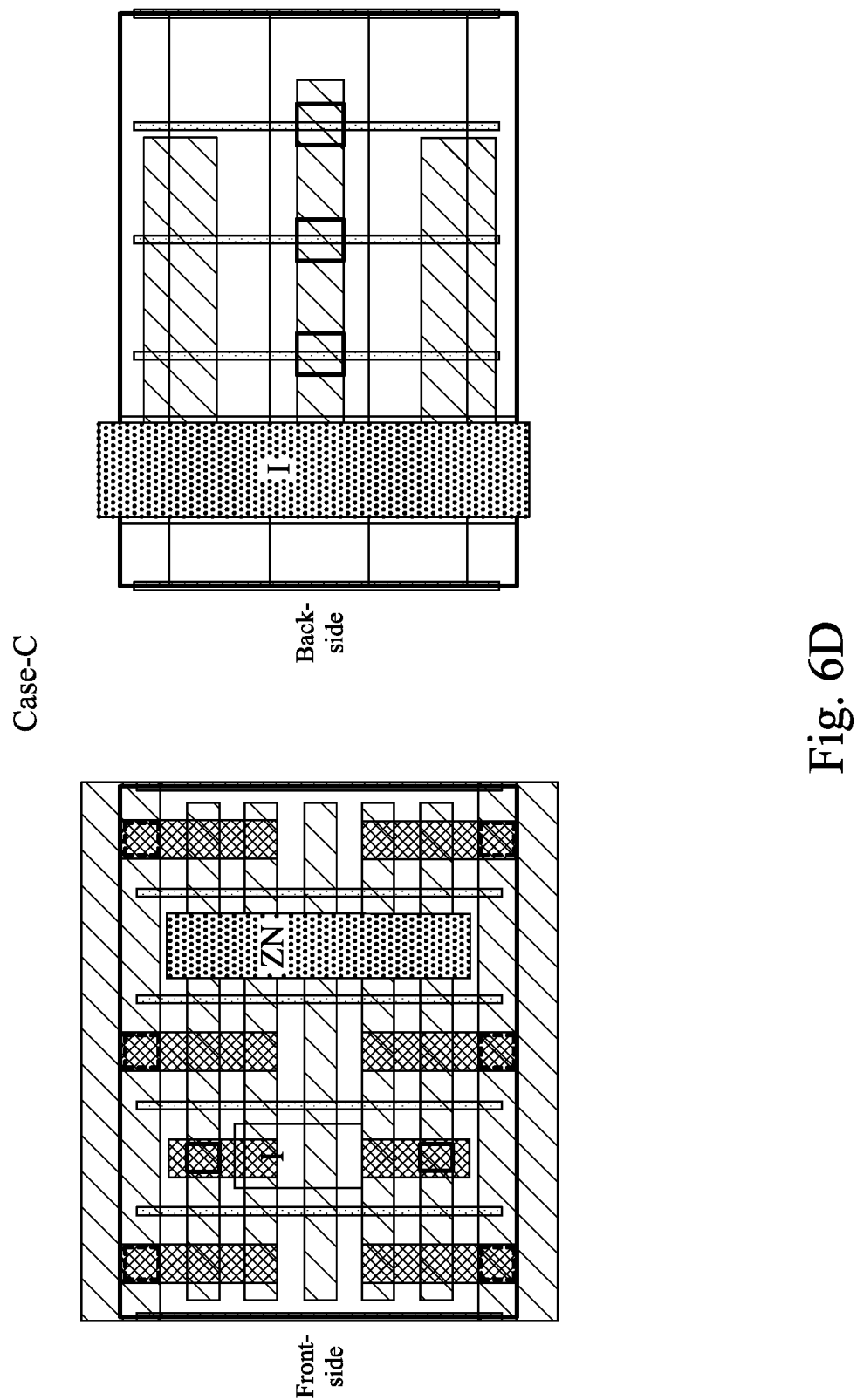
Figure 6E:
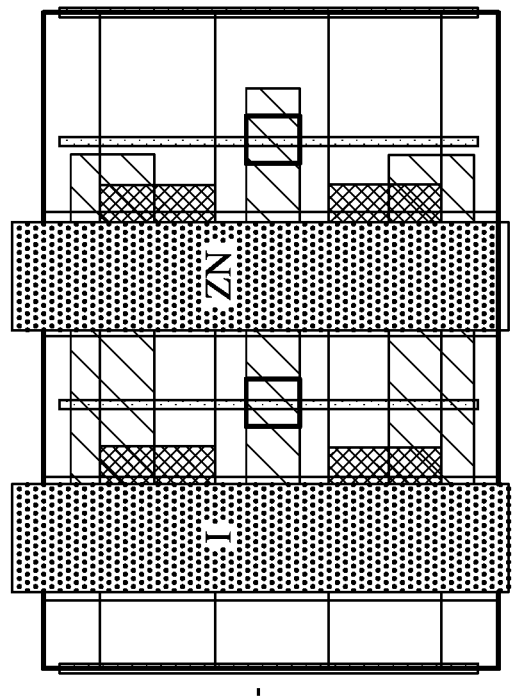
Figure 6E:
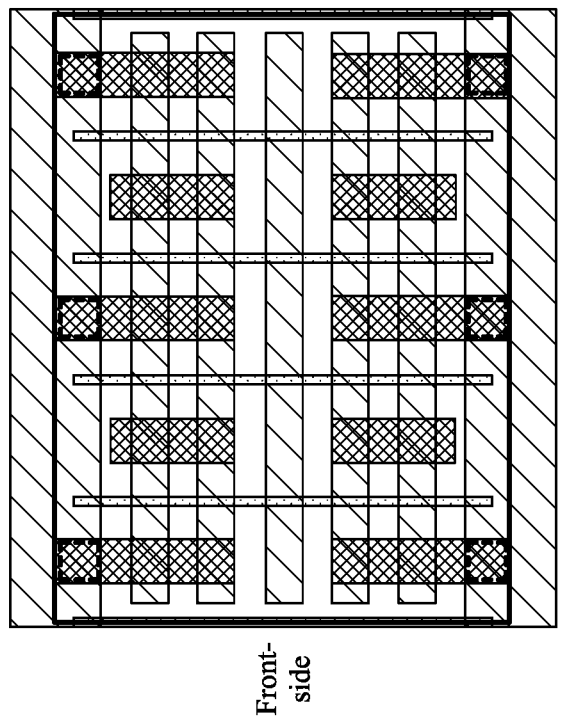

In some embodiments, one or more combinations of frontside signal routing and back sight signal routing are used to optimize performance. As an example, shown in FIG. 6A is a routing network 600 of four inverters A, B, C, D, each with a different combinations of signal routing: (A) frontside signal routing for both input and output; (B) frontside signal routing for input and backside signal routing for output; (C) backside signal routing for input and frontside signal routing for output; and (D) backside signal routing for both input and output. More detailed diagrams showing the input (I) and output (ZN) for each inverter are provided in FIGS. 6B-6E. The inventors have discovered that backside signal routing for both input and output does not necessarily result in the best performance. In some embodiments, a combination of frontside signal routing and back sight signal routing are used and result in optimized performance. For example, a combination of frontside signal routing for the input and backside signal routing for the output for any inverter (Case-C in this example) generates the best performance in some embodiments.

Figure 7A:
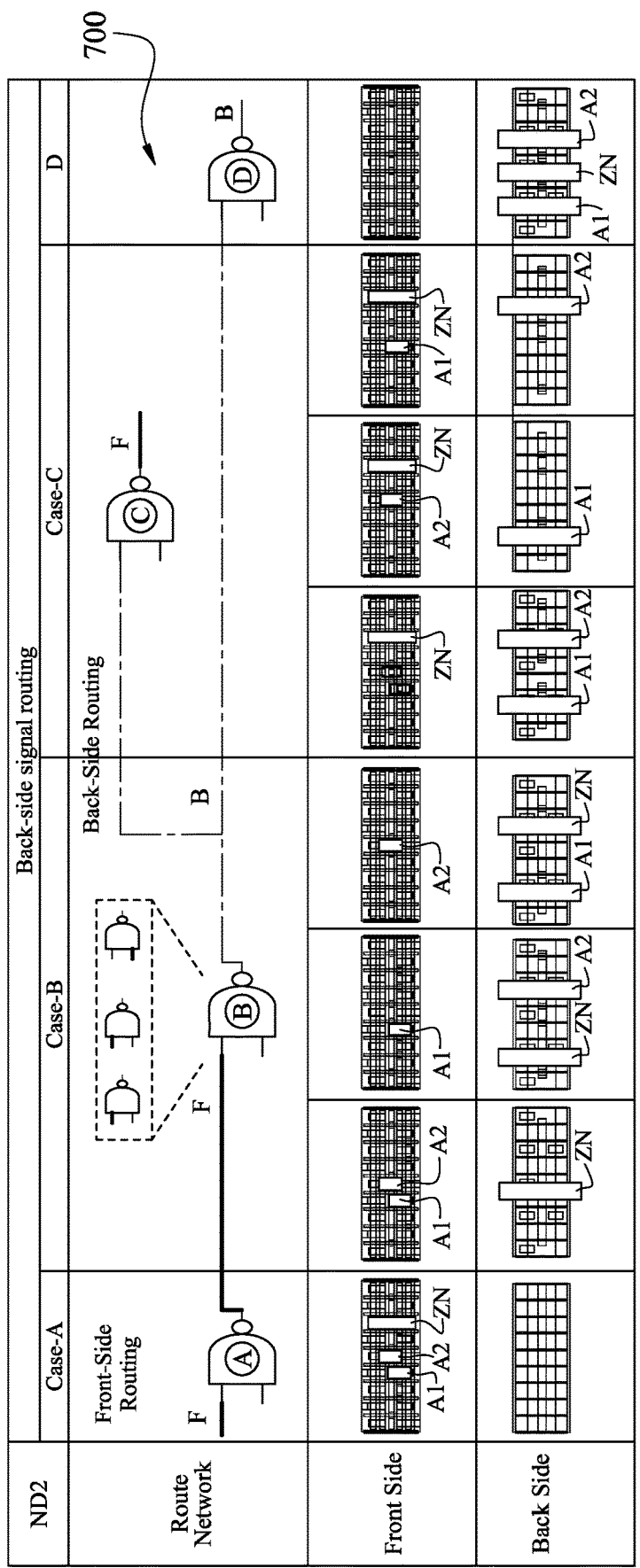
Figure 7C:
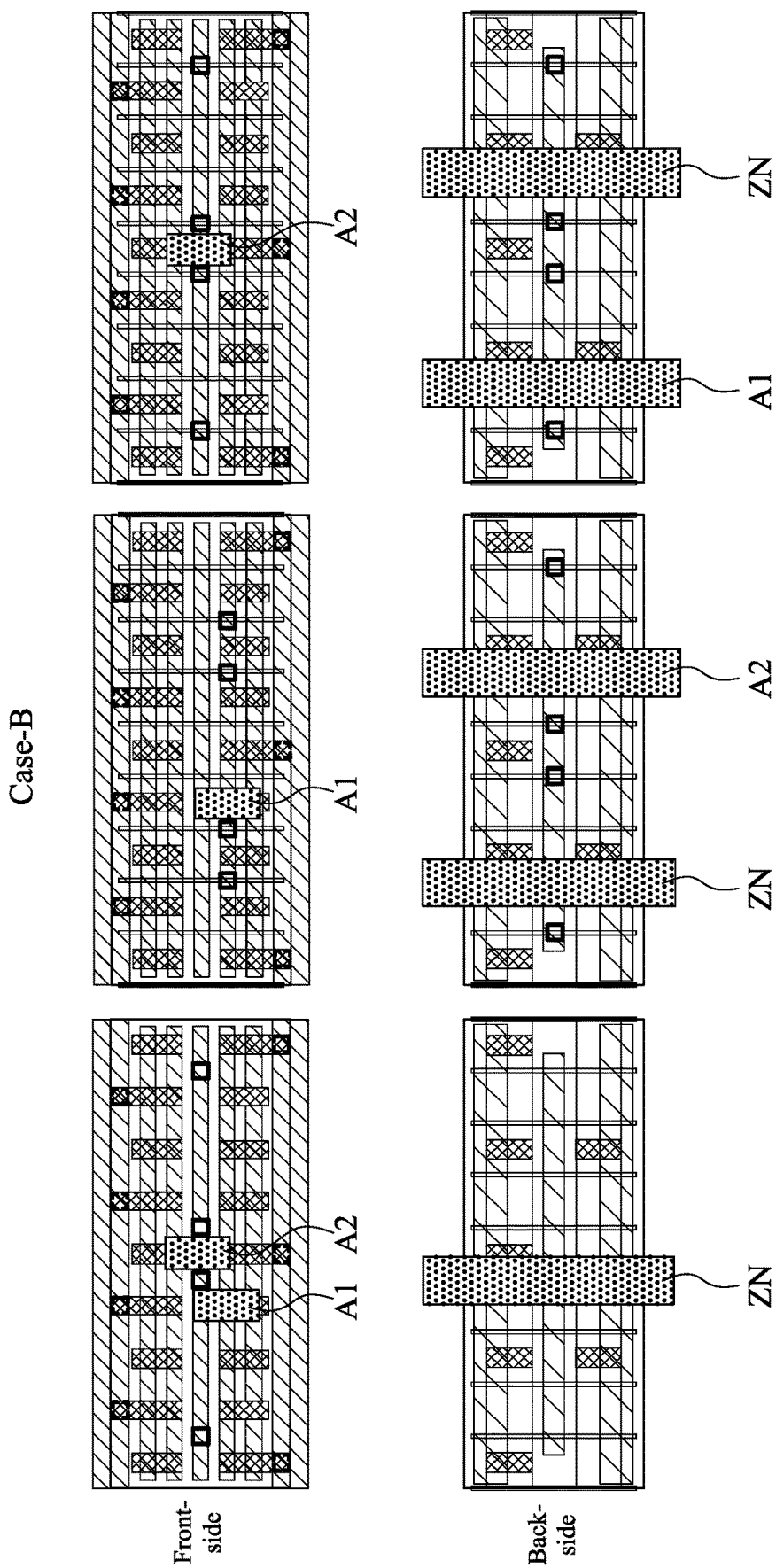
Figure 7D:
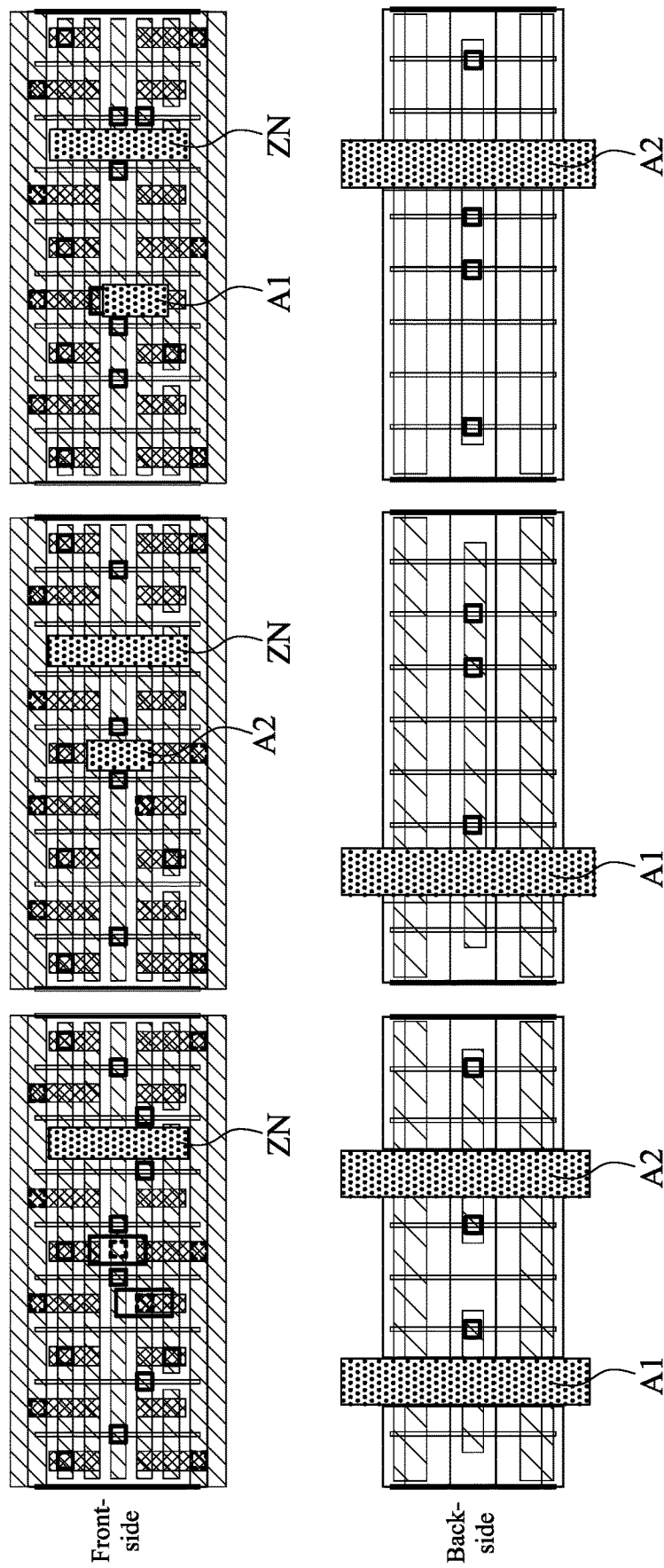
Figure 7E:
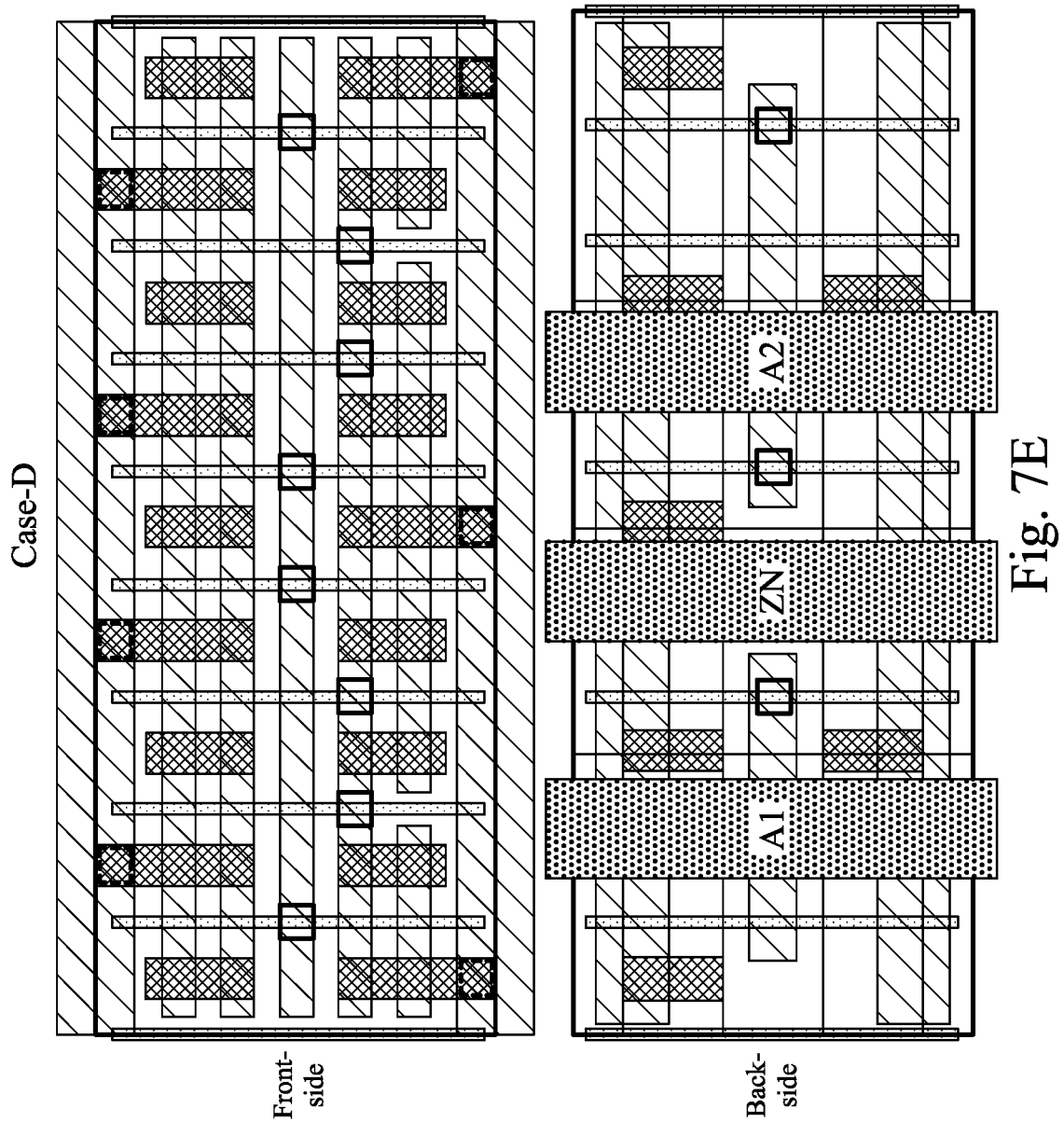

As another example, shown in FIG. 7A is a routing network 700 of four NAND gates, or combinations of NAND gates, A, B, C, D, each with a different combinations of signal routing: (A) frontside signal routing for both inputs and output; (B) frontside signal routing for input and backside signal routing for output for the three-NAND-gate cascade (with frontside inputs A1, A2 and backside output ZN for the first NAND gate; frontside input A1, backside input A2, and backside output ZN for the second NAND gate; and backside input A1, frontside input A2, and backside output ZN for the third NAND gate); (C) backside signal routing for input and frontside signal routing for output for the three-NAND-gate cascade (with backside inputs A1, A2 and frontside output ZN for the first NAND gate; backside inputs A1, frontside input A2, and frontside output ZN for the second NAND gate; and frontside inputs A1, backside input A2, and frontside output ZN for the third NAND gate); and (D) backside signal routing for both inputs and output. More detailed diagrams showing the inputs (A1, A2) and output (ZN) for each inverter are provided in FIGS. 7B-7E.

Figure 8:
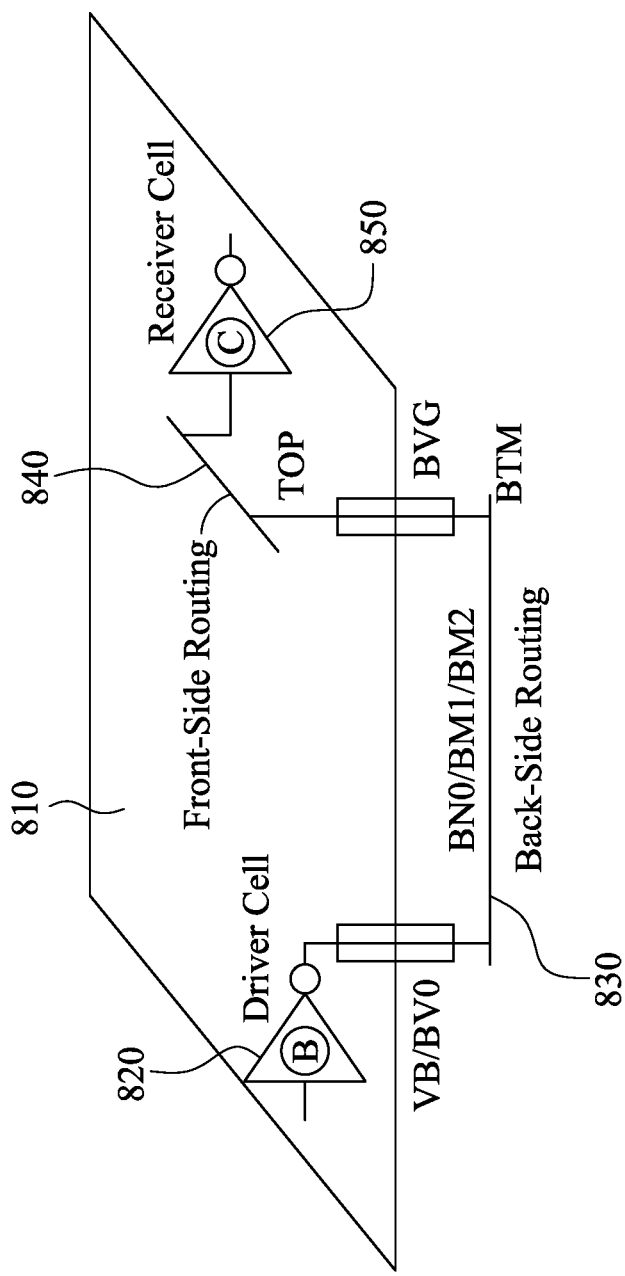
FIG. 8 schematically shows an example long distance data transmission system between to inverters according to some embodiments.

In some embodiments, such as the example shown in FIG. 8, backside signal routing is used for long-distance signal routing. In the example shown in FIG. 8, the output of a driving cell 820 formed on the top of a substrate 810 is connected to a backside route 830 through one or more vias (VB, VB0). The backside route 830 includes one or more traces one or more backside metal layers BM0, BM1, BM2, etc. The backside route a 30 is connected to a frontside route 840, which can include one or more traces and one or more frontside metal layers, through one or more vias BVG. Finally, the frontside route 840 is connected to the input of the receiving cell 850 formed on the top of the substrate 810. Because of the generally wider pitch, and thus lower impedance, of the backside route 830, the RC constant, for the signal route 830, 840 between the driving cell 820 and the receiving cell 850 as compared to frontside signal routing, the speed of data transmission between the driving cell 820 and the receiving cell 850 is improved.

Figure 9:
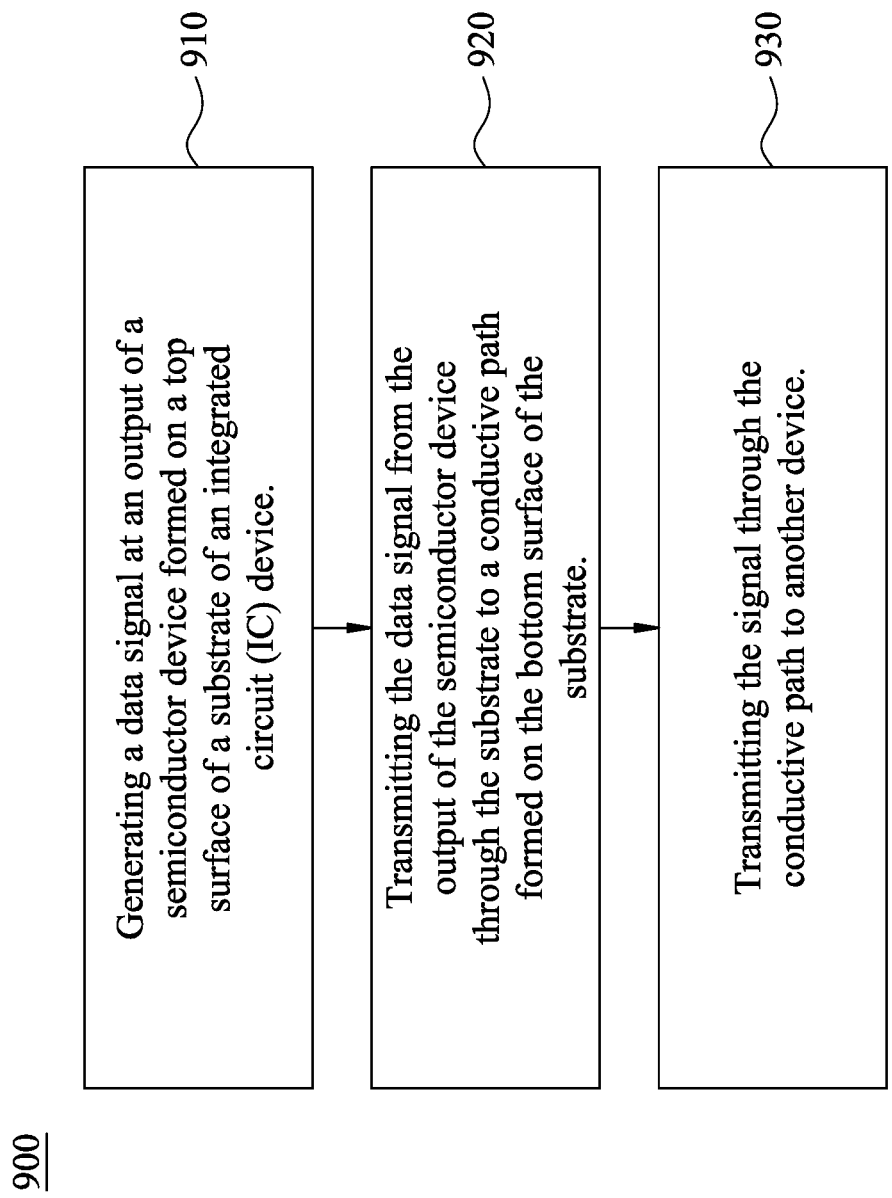
FIG. 9 outlines a method of signal routing in an IC device according to some embodiments.

In some embodiments, as outlined in FIG. 9, a method 900 of data transmission includes: generating 910 a data signal at an output of a semiconductor device formed on a frontside of a substrate of an integrated circuit (IC) device; transmitting 920 the data signal from the output of the semiconductor device through the substrate to a conductive path formed on the bottom surface of the substrate; and transmitting 930 the signal through the conductive path to another device.

Figure 10:
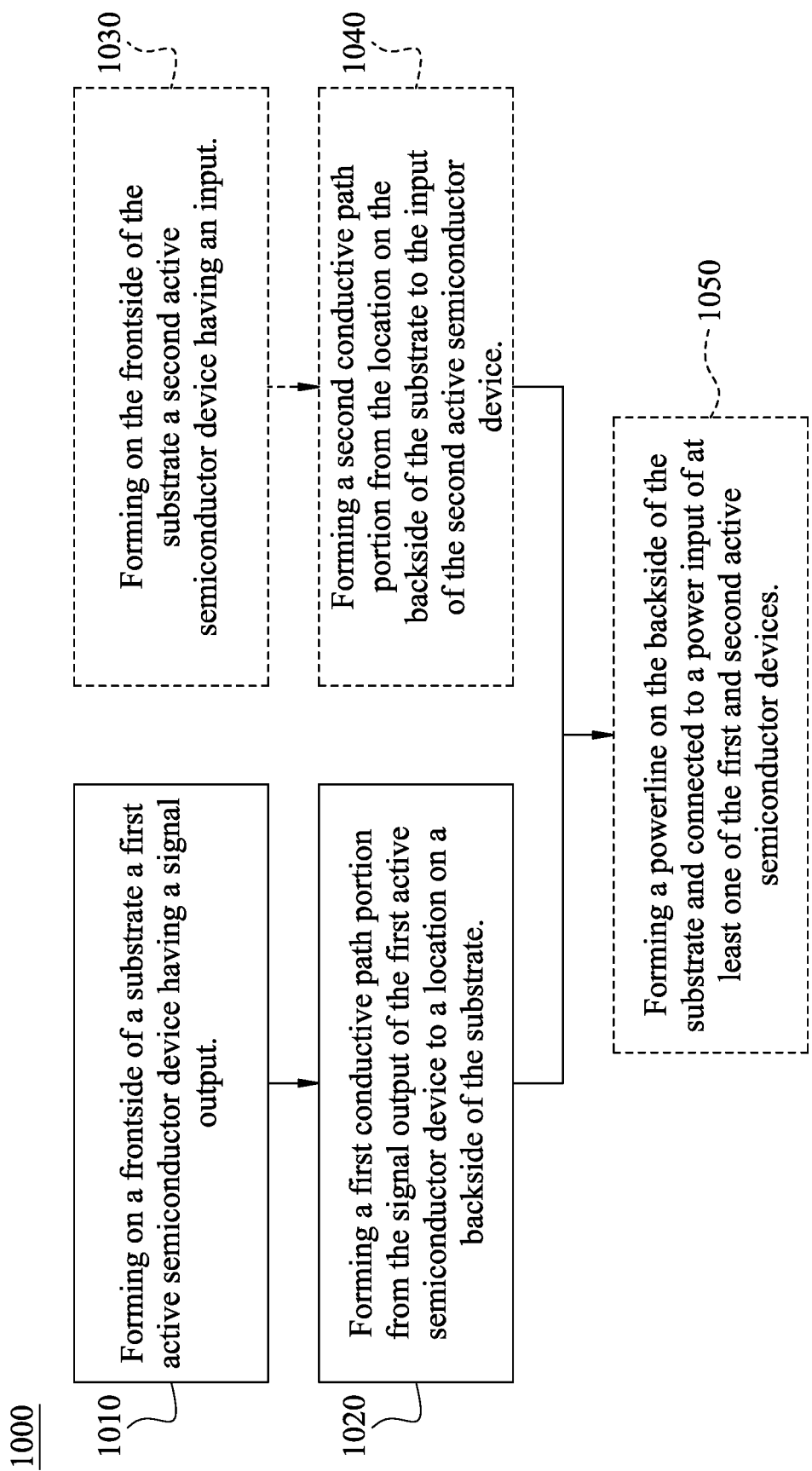
FIG. 10 outlines a method of manufacturing an integrated circuit device according to some embodiments.

In some embodiments, as outlined in FIG. 10, a method 1000 of manufacturing an integrated circuit device includes: forming 1010 on a frontside of a substrate a first active semiconductor device having a signal output; and forming 1020 a first conductive path portion from the signal output of the first active semiconductor device to a location on a backside of the substrate. In some embodiments, the method further includes forming 1030 on the frontside of the substrate a second active semiconductor device having an input, such as gates transistors in a CMOS inverter; and forming 1040 a second conductive path portion from the location on the backside of the substrate to the input of the second active semiconductor device. In some embodiments, the method further includes forming 1050 a powerline on the backside of the substrate and connected to a power input of at least one of the first and second active semiconductor devices. The order of forming the one or more active semiconductor devices, conductive paths and powerlines can vary in different embodiments, depending the specifics of the circuit design and processing considerations. The structure achieved remains: one or more active semiconductor devices on the frontside of the substrate, one or more conductive lines formed on the backside of the substrate and connected to the input and/or output of the one or more active semiconductor devices; and, optionally, one or more powerlines formed on the backside of the substrate and connected to the power input of the one or more active semiconductor devices.

By routing signals through backside metal layers in IC devices, wider pitch traces can be used, thereby reducing the routing impedance and enhance device performance. Certain configurations using backside signal routing in IC devices also minimize the impact of high resistance from the EPI region by providing multiple backside conductive paths located in the conductive layer (BM0) nearest the active device layer and connecting to corresponding output components (for example, source/drain of transistors in an inverter).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a substrate having a frontside and a backside;
a first active semiconductor device formed on the frontside of the substrate and having an input and an output;
one or more layers of conductive paths formed on the frontside of the substrate; and
one or more layers of conductive paths formed on the backside of the substrate,
at least one of the input and output of the first active semiconductor device being electrically connected to the one or more layers of conductive paths formed on the backside of the substrate, wherein the at least one of the input and output of the first active semiconductor device is electrically connected to the one or more layers of conductive paths formed on the backside of the substrate not through any of the one or more layers of conductive path formed on the frontside of the substrate.

2. The integrated circuit device of claim 1, wherein the first active semiconductor device comprises a transistor having a gate, a source, and a drain, wherein the gate is directly connected to the one or more layers of conductive paths on the backside of the substrate by a conductive pillar through the substrate.

3. The integrated circuit device of claim 1, wherein the first active semiconductor device comprises a transistor having a gate, a source and a drain, wherein at least one of the source and drain is directly connected to the one or more layers of conductive paths on the backside of the substrate by a conductive pillar through the substrate.

4. The integrated circuit device of claim 1, wherein the first active semiconductor device comprises at least two transistors, each having a gate, a source and a drain, wherein one of the source and drain of each of the transistors is directly connected to the one or more layers of conductive paths on the backside of the substrate by a respective conductive pillar through the substrate.

5. The integrated circuit device of claim 4, wherein one of the source and drain of each of the transistors is directly connected to a respective conductive path in the one of the one or more conductive paths on the backside of the substrate by a respective conductive pillar through the substrate.

6. The integrated circuit device of claim 1, wherein the one or more layers of conductive paths include one or more conductive paths configured to supply power to the first active semiconductor device.

7. The integrated circuit device of claim 1, wherein at least a first conductive path in the one or more layers of conductive paths formed on the backside of the substrate is connected to at least a first conductive path in the one or more layers of conductive paths formed on the frontside of the substrate by a conductive pillar.

8. The integrated circuit device of claim 7, further comprising a second active semiconductor device formed on the frontside of the substrate had having an input and an output, wherein:
the at least first conductive path in the one or more layers of conductive paths formed on the backside of the substrate is connected to the at least first conductive path in the one or more layers of conductive paths formed on the frontside of the substrate,
the output of the first active semiconductor device is connected to one of the at least first conductive path in the one or more layers of conductive paths formed on the backside of the substrate and the at least first conductive path in the one or more layers of conductive paths formed on the frontside of the substrate by a respective conductive pillar, and
the input of the second active semiconductor device is connected to the other one of the at least first conductive path in the one or more layers of conductive paths formed on the backside of the substrate and the at least first conductive path in the one or more layers of conductive paths formed on the frontside of the substrate by a respective conductive pillar.

9. The integrated circuit device of claim 1, wherein:
the input of the first active semiconductor device is connected to one or more conductive paths in the one or more layers of conductive paths formed on the backside of the substrate by a respective conductive pillar; and
the output of the first active semiconductor device is connected to one or more conductive paths in the one or more layers of conductive paths formed on the frontside of the substrate by a respective conductive pillar.

10. The integrated circuit device of claim 1, wherein:
the input of the first active semiconductor device is connected to one or more conductive paths in the one or more layers of conductive paths formed on the frontside of the substrate by a respective conductive pillar; and
the output of the first active semiconductor device is connected to one or more conductive paths in the one or more layers of conductive paths formed on the backside of the substrate by a respective conductive pillar.

11. The integrated circuit device of claim 1, wherein:
the input of the first active semiconductor device is connected to a first conductive path in the one or more layers of conductive paths formed on the backside of the substrate by a respective conductive pillar; and
the output of the first active semiconductor device is connected to a second conductive path in the one or more layers of conductive paths formed on the backside of the substrate by a respective conductive pillar.

12. An integrated circuit device, comprising:
a substrate having a frontside and a backside;
a first active semiconductor device formed on the frontside of the substrate and have an input and an output;
a second active semiconductor device formed on either the frontside or backside of the substrate and have an input and an output;
a plurality of conductive paths disposed on the frontside of the substrate; and
a plurality of conductive paths disposed on the backside of the substrate,
the output of the first active semiconductor device being connected to the input of the second active semiconductor device by a conductive path comprising at least one of the plurality of conductive paths disposed on the backside of the substrate.

13. The integrated circuit device of claim 12, the second active semiconductor device being formed on the frontside of the substrate, the conductive path connecting the output of the first active semiconductor device and the input of the second active semiconductor device further comprising at least one of the plurality of conductive paths disposed on the frontside of the substrate.

14. The integrated circuit device of claim 12, wherein the first active semiconductor device comprises a transistor having a gate, a source, and a drain, wherein the gate is directly connected to at least one of the plurality of conductive paths disposed on the backside of the substrate by a conductive pillar through the substrate.

15. The integrated circuit device of claim 12, wherein the first active semiconductor device comprises a transistor having a gate, a source and a drain, wherein at least one of the source and drain is directly connected to at least one of the plurality of conductive paths disposed on the backside of the substrate by a conductive pillar through the substrate.

16. The integrated circuit device of claim 12, wherein the first active semiconductor device comprises at least two transistors, each having a gate, a source and a drain, wherein one of the source and drain of each of the transistors is directly connected to at least one of the plurality of conductive paths disposed on the backside of the substrate by a respective conductive pillar through the substrate.

17. The method of claim 12, where the connecting the output of the first active semiconductor device to the input of the second active semiconductor device conductive path comprises forming a second conductive portion disposed on the frontside of the substrate, and a conductive pillar connecting the first conductive portion to the second conductive portion.

18. A method of manufacturing an integrated circuit device, the method comprising:
   forming on a frontside of a substrate a first active semiconductor device having a signal output;
   forming on either the frontside or backside of the substrate a second active semiconductor device having an input;
   forming a conductive path comprising a first conductive portion disposed on the backside of the substrate; and
   connecting the output of the first active semiconductor device to the input of the second active semiconductor device through the conductive path.

19. The method of claim 18, wherein forming the second active semiconductor device comprises forming the second active semiconductor device on the frontside of the substrate.

20. The method of claim 19, further comprising:
   forming a powerline on the backside of the substrate and connected to a power input of at least one of the first and second active semiconductor devices.

\* \* \* \* \*